United States Patent
Mei et al.

(10) Patent No.: US 10,165,677 B2
(45) Date of Patent: Dec. 25, 2018

(54) BARE DIE INTEGRATION WITH PRINTED COMPONENTS ON FLEXIBLE SUBSTRATE WITHOUT LASER CUT

(71) Applicant: Palo Alto Research Center Incorporated, Palo Alto, CA (US)

(72) Inventors: Ping Mei, San Jose, CA (US); Tse Nga Ng, San Diego, CA (US); Brent S. Krusor, Fremont, CA (US); Gregory L. Whiting, Menlo Park, CA (US); Steven E. Ready, Los Altos, CA (US); Janos Veres, San Jose, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 52 days.

(21) Appl. No.: 14/965,039

(22) Filed: Dec. 10, 2015

(65) Prior Publication Data
US 2017/0171958 A1    Jun. 15, 2017

(51) Int. Cl.
*H05K 1/02*  (2006.01)
*H05K 1/03*  (2006.01)
(Continued)

(52) U.S. Cl.
CPC .......... *H05K 1/028* (2013.01); *H01L 21/568* (2013.01); *H01L 24/19* (2013.01); *H01L 24/20* (2013.01);
(Continued)

(58) Field of Classification Search
CPC ...... H05K 1/028; H05K 1/0326; H05K 1/185; H05K 1/187; H05K 3/007; H05K 3/20;
(Continued)

(56) References Cited

U.S. PATENT DOCUMENTS 4,658,330 A    4/1987  Berg
4,731,645 A    3/1988  Parmentier
(Continued)

FOREIGN PATENT DOCUMENTS

CN      104517911 A      4/2015
DE   10 2013 201 926 A1  8/2014
EP        2 639 278 A1   9/2013

OTHER PUBLICATIONS

Fjelstad, "Solderless Assembly of Electronic Products—a More Reliable and More Cost Effective Approach to Electronics Manufacturing?", Vehicle Power and Propulsion Conference, 2009. VPPC '09., IEEE, 7 pgs.
(Continued)

*Primary Examiner* — Peter DungBa Vo
*Assistant Examiner* — Azm Parvez
(74) *Attorney, Agent, or Firm* — Fay Sharpe LLP

(57) ABSTRACT

Provided is a manufacturing process for electronic circuit components such as bare dies, and packaged integrated chips, among other configurations, to form electronic assemblies. The surface of the electronic circuit component carries electronic elements such as conductive traces and/or other configurations including contact pads. A method for forming an electronic assembly includes providing a tacky layer. Then an electronic circuit component is provided having a first side and a second side, where the first side carries the electronic elements. The first side of the electronic circuit component is positioned into contact with the tacky layer. A bonding material is then deposited to a portion of the adhesive layer that is not covered by the first side of the electronic circuit component, to a depth which is sufficient to cover at least a portion of the electronic circuit component. The bonding material is then fixed or cured into a fixed or cured bonding material, and the tacky layer is removed. By these operations, the electronic circuit component is held
(Continued)

in a secure attachment by the fixed or cured bonding material, and circuit connections may be made.

13 Claims, 10 Drawing Sheets

(51) Int. Cl.
*H05K 1/18* (2006.01)
*H05K 3/14* (2006.01)
*H01L 21/56* (2006.01)
*H01L 23/00* (2006.01)
*H01L 23/31* (2006.01)

(52) U.S. Cl.
CPC .............. *H01L 24/24* (2013.01); *H01L 24/76* (2013.01); *H01L 24/82* (2013.01); *H01L 24/96* (2013.01); *H05K 1/0326* (2013.01); *H05K 1/185* (2013.01); *H05K 3/14* (2013.01); *H01L 23/3107* (2013.01); *H01L 2224/24011* (2013.01); *H01L 2224/24051* (2013.01); *H01L 2224/24105* (2013.01); *H01L 2224/24991* (2013.01); *H01L 2224/76151* (2013.01); *H01L 2224/76155* (2013.01); *H01L 2224/76252* (2013.01); *H01L 2224/82051* (2013.01); *H01L 2224/8285* (2013.01); *H01L 2224/82181* (2013.01); *H01L 2224/82986* (2013.01); *Y10T 29/4913* (2015.01)

(58) Field of Classification Search
CPC .............. H05K 3/4682; Y10T 29/4913; Y10T 29/49124; Y10T 29/49117; Y10T 29/49002
USPC ................................ 29/832, 829, 825, 592.1
See application file for complete search history.

(56) References Cited

U.S. PATENT DOCUMENTS

| | | | |
|---|---|---|---|
| 5,976,912 A * | 11/1999 | Fukutomi | H01L 21/4803 257/E21.502 |
| 6,815,251 B1 | 11/2004 | Akram | |
| 2002/0153832 A1 | 10/2002 | Yanagisawa et al. | |
| 2006/0258044 A1 | 11/2006 | Meyer et al. | |
| 2007/0183273 A1* | 8/2007 | Arai | G11B 7/12 369/44.11 |
| 2009/0056997 A1 | 3/2009 | Fjelstad | |
| 2010/0013076 A1 | 1/2010 | Jang et al. | |
| 2012/0008287 A1 | 1/2012 | Kim et al. | |
| 2012/0049388 A1 | 3/2012 | Pagaila | |
| 2012/0268899 A1 | 10/2012 | Haba et al. | |
| 2012/0326271 A1 | 12/2012 | Teh | |
| 2013/0036829 A1* | 2/2013 | Van Steenberge | G01L 1/24 73/800 |
| 2013/0056867 A1 | 3/2013 | Pagaila et al. | |
| 2014/0291001 A1 | 10/2014 | Lin | |
| 2015/0162218 A1* | 6/2015 | Cheung | H01L 24/83 174/251 |
| 2015/0228508 A1 | 8/2015 | Whiting et al. | |
| 2017/0048986 A1 | 2/2017 | Mei | |

OTHER PUBLICATIONS

Xie et al., "Heterogeneous Integration of Bio-Sensing System-on-Chip and Printed Electronics", IEEE Journal on Emerging and Selected Topics in Circuits and Systems (JETCAS), vol. 2, No. 4, pp. 672,682, Dec. 2012.

EP Search Report dated Nov. 9, 2017—Application No. 16202082.0 (18 pgs).

* cited by examiner

BARE DIE INTEGRATION WITH PRINTED COMPONENTS ON FLEXIBLE SUBSTRATE WITHOUT LASER CUT

BACKGROUND

The present application is directed to electronic fabrication and more particularly fabrication of hybrid electronic platforms, which are comprised of different types of components such as integrated circuits and discrete components located on a common substrate. Hybrid electronic platforms employ cost-effective, large-area manufacturing techniques while keeping the same complex functionality and processing capability as silicon-based systems. Due to temperature and mechanical reasons, traditional silicon integration methods, such as solder bonding and wire bonding may not be suitable for hybrid platforms which may include flexible printed electronics. Various packaging techniques have been developed for chip integration on flexible substrates. For example, anisotropic conductive film (ACF) can be applied to bond and connect a chip to a circuit on a plastic substrate. However, a downside of this method is the limitation of the minimal size of the contact pads on the chip which can be bond with the adhesive.

It is considered useful to provide techniques and arrangements which overcome the noted limitations and others.

BRIEF DESCRIPTION

Provided is a manufacturing process for electronic circuit components such as bare dies, and packaged integrated chips, among other configurations, to form electronic assemblies. The surface of the electronic circuit component carries electronic elements such as conductive traces and/or other configurations including contact pads. A method for forming an electronic assembly includes providing a tacky layer. Then an electronic circuit component is provided having a first side and a second side, where the first side carries the electronic elements. The first side of the electronic circuit component is positioned into contact with the tacky layer. A bonding material is then deposited to a portion of the tacky layer that is not covered by the first side of the electronic circuit component, to a depth which is sufficient to cover at least a portion of the electronic circuit component. The bonding material is then fixed or cured into a fixed or cured bonding material, and the tacky layer is removed. By these operations, the electronic circuit component is held in a secure attachment by the fixed or cured bonding material and circuit connections are made.

DETAILED DESCRIPTION

In the following discussion the use of the term "electronic circuit component(s)" is to be understood to include any of a number of electronic circuit configurations including but not limited to bare die, electronic packaged electronic chips, among others.

In order to provide a manufacturing process for electronic circuit component integration on a flexible substrate, the present discussion discloses methods and structures to facilitate high resolution connection with a printing process. In certain ones of the embodiments, a surface of the electronic circuit component, which carries electronic elements including contact pads and other electronic circuitry, is at the same level as the substrate (e.g., a cured bonding material). This arrangement permits high resolution patterning to be readily performed to construct or lay down conductive traces or connections between the circuitry on the electronic circuit component and circuitry on the substrate.

To meet the challenge of the complexity of packaging, certain embodiments employ a printing technology, such as one commonly referred to as inkjet type printing which offers capabilities to enable high density and low resistance interconnections. Others include but are not limited to aerosol printing and extrusion printing. With use of printing technology (e.g., inkjet type, 3D, etc.), standard wire bonding processes can be replaced when the interconnections are made of printed conductive (e.g., metal) lines on a flat, planar level area. Thus the material being printed is understood to be a printable conductive material.

Figure 1:
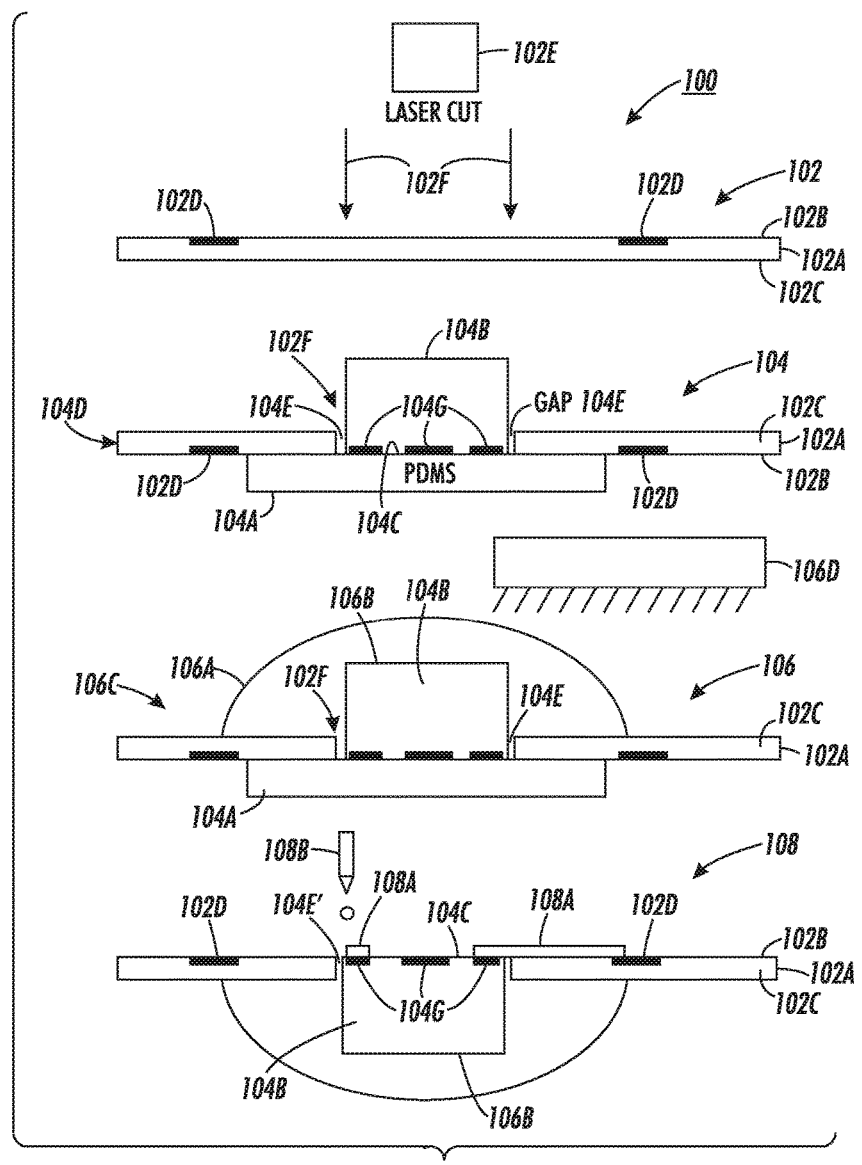
FIG. 1 illustrates a method and structure to facilitate a high resolution connection between an electronic circuit component with a flexible substrate using a laser cutting process.

Turning to FIG. 1 illustrated is an assembly process 100, represented by a series of schematic diagrams 102-108 to construct a hybrid electronics platform assembly (discussed in more detail in U.S. Ser. No. 14/964,964 entitled "Bare Die Integrator With Printed Component On Flexible Substrate", by Ping Mei et al.).

As illustrated in diagram 102, providing a substrate 102A (in some embodiments the substrate is a flexible substrate, such as a plastic substrate). Substrate 102A has a first surface 102B and second surface 102C opposite the first surface. These surfaces define the height of the substrate 102A. The first surface 102B may include electronic circuitry 102D, such as but not limited to conductive circuit tracings. Also, while shown in side view, it is understood substrate 102A of course also has width and length dimensions.

A material removal device (e.g., laser) 102E forms an opening 102F (the opening 102F defined by the parallel downward facing arrow lines) within a pre-identified location of substrate 102A. More particularly at least one location on the first surface 102B of the substrate 102A appropriate to form the opening through the substrate is identified. Thereafter, the material removal device 102E performs a material removal operation to create the opening 102F in the substrate 102A, where the opening 102F is positioned within length and width boundaries of the substrate 102A, and the opening extends through the first surface 102B and the second surface 102C.

The material removal device 102E is in one embodiment a laser arrangement, while in another embodiment it is a physical contact cutting device. In further embodiments other devices capable of precisely removing material to form opening 102F may be used. It is also to be understood that multiple openings may be made in a single substrate, and the assembly process of FIG. 1 may be repeated a plurality of times for that same substrate, such that multiple openings may be formed.

The opening identified by 102F is made to conform to the shape and dimensions of a particular electronic circuit component (e.g., a bare die) being incorporated. However, a certain amount of clearance (e.g., about 5-25 μm) is provided to ensure the electronic circuit component is capable of being received. The electronic circuit component 304B is at least one of a bare die or pre-packaged electronic circuit.

In a next step shown by diagram 104, opening 102F is more clearly depicted. It is mentioned here that diagram 104 (and the other diagrams of FIG. 1) is a modified side or cross-sectional view, and for ease of understanding substrate material in front of electronic circuit component 104B is not shown. However it is to be understood that as the location of the electronic circuit component 104B is within the boundaries of the substrate 102A, there would be portions of the substrate in front of the electronic circuit component 104B, which would obstruct the view of a gap 104E, as well as the portions of the electronic circuit component 104B. It is to also be appreciated the other diagrams of FIG. 1 are also modified side or cross-sectional views.

In diagram 104 the substrate 102A has been turned over such that first surface 102B (with circuits/traces 102D) is now facing downward. Additionally, a tacky layer 104A with a tacky upper surface (e.g. a polydimethyisiloxane (PDMS) material, elastomer polymer, etc.), is positioned over the opening 102F, and at least a portion of the first surface 102B of substrate 102A. The electronic circuit component 104B with its front surface 104C facing downward is then placed in the opening 102F. It is mentioned front surface 104C includes conductive circuit traces (including contact pads, etc.) 104G. Also, it is understood the tacky layer 104A holds elements together but does not permanently bond the elements.

The upper face of the flat article 104A with the tacky surface 104A may be considered an alignment area 104D where the first surface 102B of substrate 102A and the first surface 104C of the electronic circuit component 104B are aligned in a substantially planar or flat or level relationship due to the flat article 104A.

Also shown in diagram 104 is gap 104E which exists between the end of opening 102F and electronic circuit component 104B. The gap 104E is preferred to not be overly large, but sufficient to not interfere with the placement of the electronic circuit component 104B (e.g., about 5-25 μm).

Turning to diagram 106 of FIG. 1, a bonding material 106A is applied on and over the second surface (the backside) 106B of the electronic circuit component 104B, and on and over at least some portions of the second surface 102C of the substrate 102A. This backside may be understood to be a non-alignment area 106C where the second surface 102C of the substrate 102A and the second surface 106B of the electronic circuit component 104B are not aligned (e.g., substantively planar or flat or level to each other). In other words the height of the electronic circuit component 104B is greater than the height of the substrate.

In one embodiment the bonding material 106A is a UV curable polymer dispensed onto the backside of the arrangement, the bonding material acting to seal the gap 104E. A fixing or curing arrangement (which may include curing lamps, heaters and/or other appropriate components) 106D is provided to perform fixing or curing on the bonding material (e.g., UV curable polymer). After UV curing, the UV cured polymer provides a bonding structure for the assembly. Of course, other bonding materials known in the art may also be employed in place of the UV bonding material.

In diagram 108 of FIG. 1, the assembly has been turned over and the tacky layer (e.g., a PDMS pad) 104A is separated and removed, exposing a substantially flat or planar or level surface spanning from the first surface 102B, across the filled in gap 104C' (i.e., filled in with the bonding material 106A to form a flat or planar surface), and further across the first surface 104D. It is mentioned the selected tacky material includes the characteristics of holding the mentioned components, but when separated does not leave behind undesirable amounts of residue that would otherwise interfere with the additional assembly process. Also, as an optional step, a cleaning of the component and substrate surfaces could be undertaken following separation and removal.

Finally, conductive traces 108A, extending between the first surface 102B of substrate 102A and the first surface 104D electronic circuit component 104B are formed. In one embodiment traces 108A are generated by use of an inkjet type printing device 108B (using a conductive fluid). In an alternative embodiment the traces may be formed by use of photolithography, which requires a flat or planar or level surface to form conductive traces.

Figure 2:
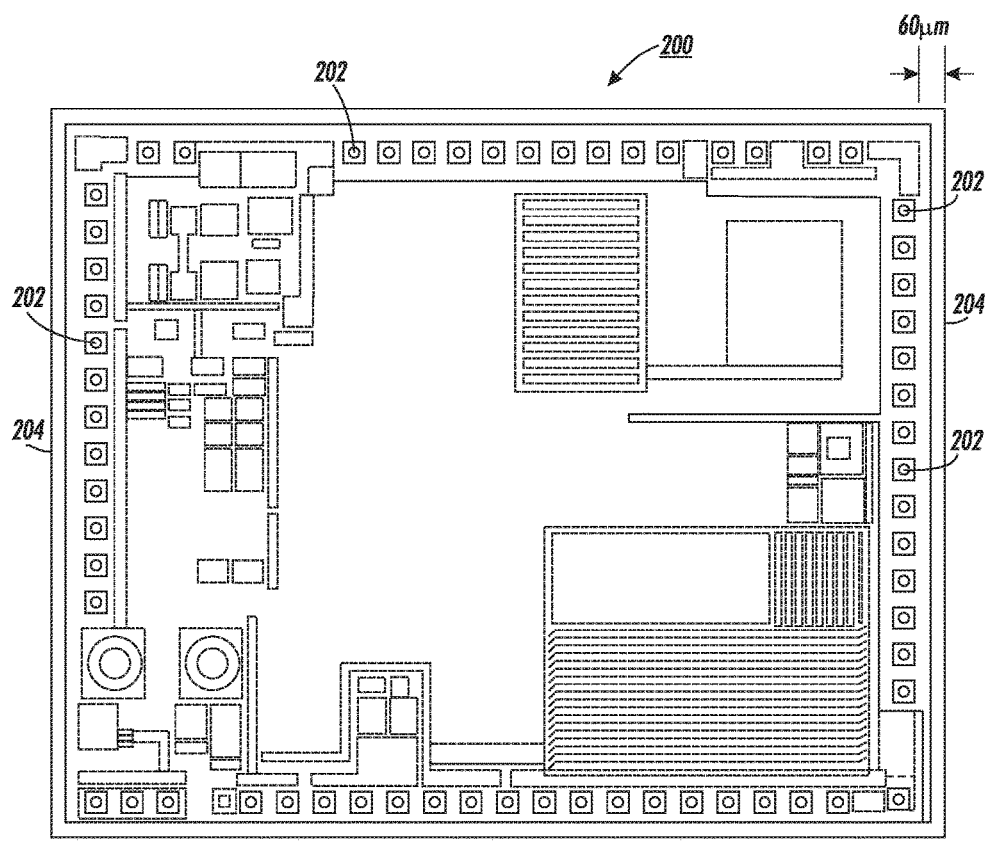
FIG. 2 depicts an electronic circuit component that may implement concepts of the present application.

Turning to FIG. 2, illustrated is an exemplary electronic circuit component such as a bare die arrangement 200, which has 36 contact pads 202 (not all pads numbered) with the smallest pitch about 120 μm and the spacing between the pads to the edge 204 of the bare die is about 60 μm. In practice, it is difficult to construct a ramp that is needed to seal a side wall of the die without covering the contact pads of the chip.

In order to provide a manufacturing process for electronic circuit component integration (including bare die, packaged chips, etc.) on a flexible, substrate, the inventors have developed a method and structure to facilitate high resolution connection with appropriate printing processes without the need to employ laser cutting. In certain embodiments, disclosed are methods and structures where a surface of an electronic circuit component is at the same level as a substrate formed from a bonding material. Therefore, high resolution patterning can be readily performed to construct conductive connections between the electronic circuit component and a circuit on the substrate.

Figure 3:
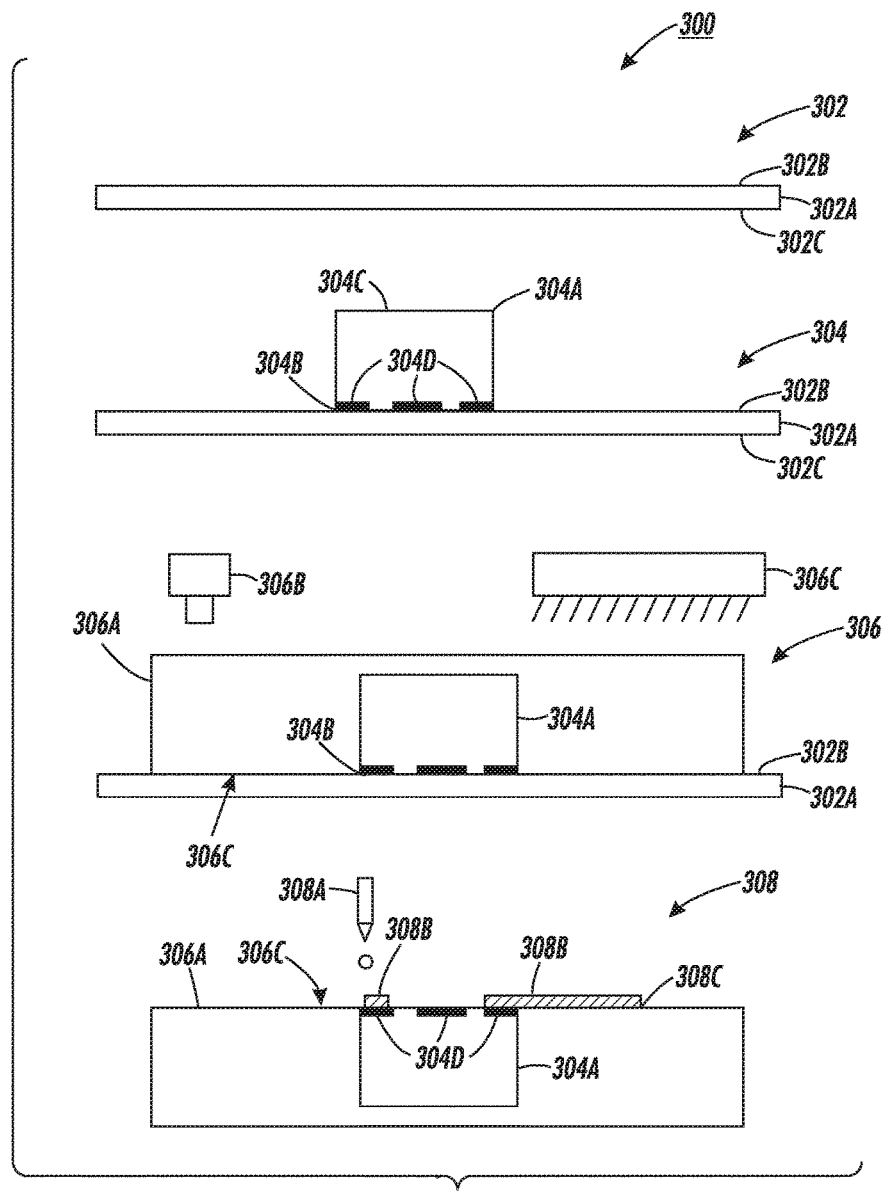
FIG. 3 illustrates an embodiment of a process according to the present application which embeds an electronic circuit component to provide a flat and exposed surface for electrical connection.

Turning to FIG. 3, illustrated is a particular embodiment of a process 300 used to embed an electronic circuit component such that it has a substantially flat or planar and exposed surface for electrical connection to components distant from the electronic circuit component 304A. In process 300, diagram 302 illustrates that a tacky layer 302A (which may be a PDMS material or other appropriate material) is provided. The tacky layer 302 includes a top surface 302B which has a tacky material carried thereon and a bottom surface 302C.

Then in diagram 304, an electronic circuit component 304A is provided (having similar characteristics to 104B of FIG. 1) and has a first or front surface or side 304B and a back or second side or surface 304C. The front or first surface or side 304B carries electronic conductive elements 304D, including but not limited to circuit traces and contact pads. As can be seen in the present process 300, the first or front side 304B is placed in contact with the (tacky) surface 302B of tacky layer 302A. This provides a non-permanent securing of the electronic circuit component 304A, such that it does not allow a liquid chemical to leak into the area under 304A to cover surface 304B and does not allow movement during the remainder of the process.

Turning to diagram 306, with the electronic circuit component 304A in a secured relationship to the tacky layer 302A, a bonding material 306A is deposited over the tacky surface 302B such that the bonding material 306A has a thickness or height sufficient to substantially hold the electronic circuit component 304A. As shown in diagram 306, the depositing of the bonding material 306A may in one embodiment be accomplished by depositing device 306B, which in various embodiments may be printing devices such as inkjet printers, aerosol printers, among others. It is also to be appreciated that other forms of depositing the bonding material 306A may be employed. It is also shown in diagram 306 that once the bonding material 306A has been deposited, it is fixed or cured by a fixing or curing device 306C. In certain embodiments, the bonding material 306A is a UV curable polymer, and the curing device 306C may be a light and/or heat generating device such as known in the art. It is to be appreciated, however, that other bonding materials that may be fixed or cured, such as to permanently set the bonding material, may also be employed.

With continuing attention to diagram 306, it may be seen that the fixed or cured bonding material 306A includes a surface 306B which is substantially planar or in-line with first or front surface or side 304C of electronic circuit component 304A. This is seen more easily in diagram 308.

After the bonding material 306A has been fixed or cured, tacky layer 302A is removed by separating or pulling away the tacky portion 302B from the cured, fixed bonding material 306A and the electronic circuit component 304A. It is known that a PDMS and other material allows for removal without damaging components to which it has been connected. If desired, a cleaning operation may also be undertaken.

Turning to diagram 308, the structure has now been rotated approximately 180° such that first or front surface or side 304B of electronic circuit component 304A is facing toward the upper end of the page. As can be seen in diagram 308, the electronic circuit component 304A is now embedded in a permanent manner in the cured or fixed bonding material 306A. At this point, a depositing device 308A, such as a printer (e.g., inkjet printer, acoustic printer, etc.) is used to print conductive traces 308B to make a connection between the electronic circuit component 304A to point 308C distant from the electronic circuit component 304A. Point 308C may in one embodiment be a contact pad for other electronic elements (e.g., similar to that shown in FIG. 1). The cured or fixed bonding material 306A may be considered a form of substrate, particularly a flexible substrate without a gap between the substrate 306A and the electronic component 304A. Also, as can be seen in diagram 308, the upper surface 306B of the fixed or cured bonding material 306A and surface 304B are substantially in-line, even or planar with each other. This allows for the printer to simply print across this area for printing of the conductive traces without employing a ramp, and without employing cutting of a substrate such as done in the process of FIG. 1.

Figure 4:
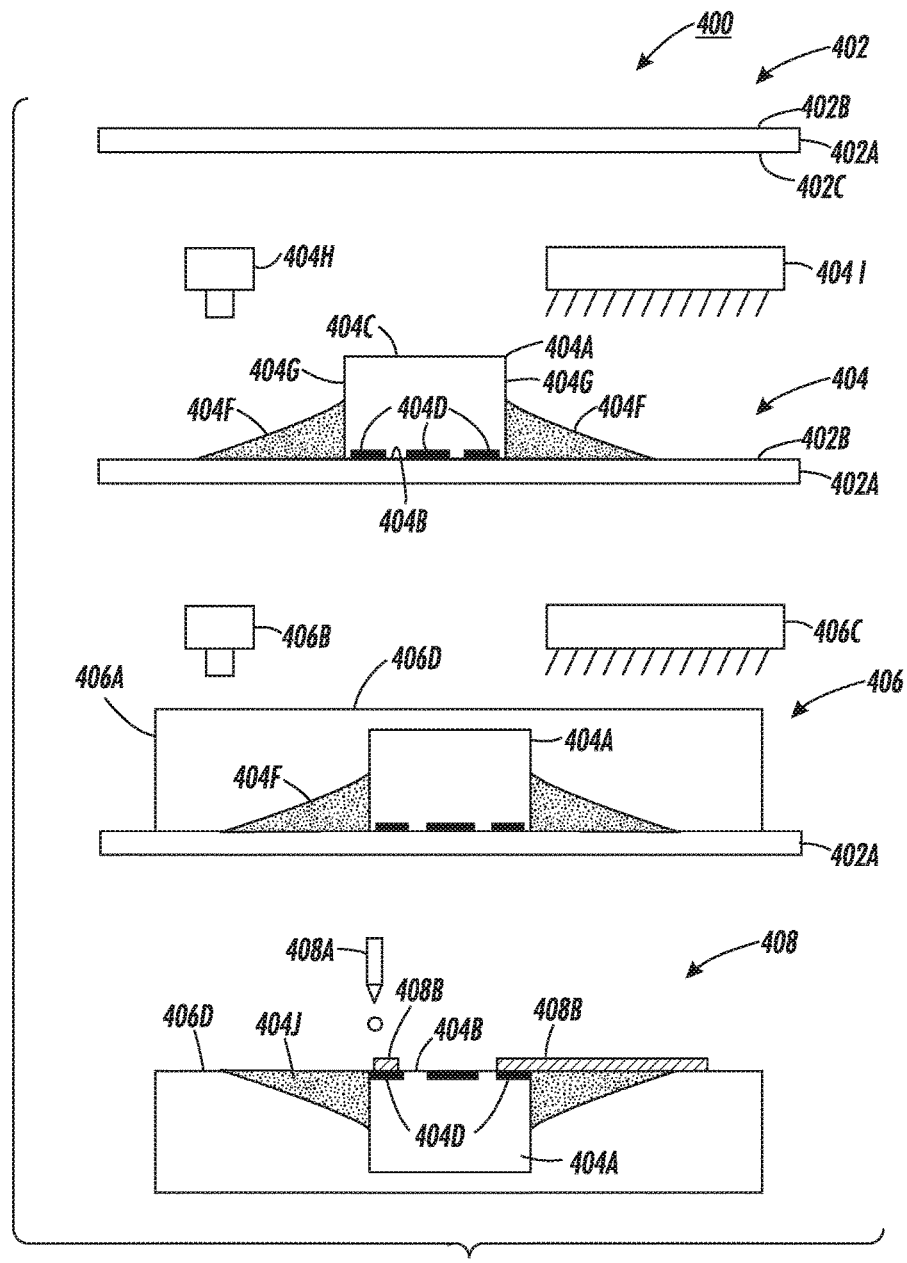
FIG. 4 illustrates another embodiment of a process according to the present application depicting a two-layer structure for embedding an electronic circuit component having a flattened exposed surface for electrical connection.

Turning to FIG. 4, illustrated is another embodiment of an assembly process 400 according to the present teachings. Diagram 402 illustrates that the process includes providing a tacky layer 402A (e.g., a PDMS material or other appropriate layer) which has a tacky upper surface 402B and a bottom surface 402C. In this embodiment and similar to that of diagram 304 (of FIG. 3), diagram 404 of the present embodiment illustrates that an electronic circuit component 404A (similar to electronic circuit component 304A of FIG. 3) is placed into contact with the upper surface 402B of tacky layer 402A, in such a way that a first or front surface or side 404B of electronic circuit component 404A is held by the tacky layer 402A, while the second or back side or surface 404C of the electronic circuit component 404A is not in contact with the tacky layer 402A. It is noted the front or first surface or side 404B contains electronic 404D elements such as but not limited to conductive tracings (including contact pads).

However, distinct from the previous embodiment, a preliminary bonding material 404F is deposited on the surface 402B of the tacky layer 402A and extending in a height dimension onto side walls 404G of the electronic circuit component 404A. In one embodiment, this preliminary bonding material 404F is deposited by a depositing device 404H, such as is known in the art, and would include but is not limited to inkjet type printers, aerosol printers, extrusion printing devices, etc. Once the preliminary bonding material 404F has been deposited such that it extends up the side walls 404G (at least partially) of electronic circuit component 404A, a fixing or curing device 404I acts upon the bonding material 404F in order to fix or cure the preliminary bonding material to a permanent state. It is noted in one embodiment, the preliminary bonding material 404F may be a UV curable polymer, and the curing or fixing device 404I may be a light/heat generating device sufficient to fix or cure the preliminary bonding material, as is known in the art.

Turning to diagram 406, once the preliminary bonding material 404F has been fixed or cured, a second planarization or other bonding material 406A is deposited via a depositing device 406B. This may in certain embodiments be the same depositing device as used in diagram 404, while in other embodiments it may be different. The bonding material 406A in certain embodiments is deposited to a thickness sufficient to cover the electronic circuit component 404A as well as the preliminary fixed bonding material 404F. Following the depositing of the bonding material 406A, a fixing or curing device 406C ensures that the planarization or other bonding material is fixed or cured to a permanent state with a surface 406D (it is to be noted that the fixing or curing device 406C of diagram 406 may be a separate device from the curing or fixing device 404H of diagram 404, while in other embodiments, they may be the same device).

Following the fixing or curing of planarization or other bonding material 406A, tacky layer 402A is removed in a manner such as known in the art and as previously discussed.

Thereafter, and as shown more clearly in diagram 408, the assembly is rotated essentially 180° in the drawing such that the surface of the electronic circuit component 404A having conductive traces, contact pads, etc. 404D are shown pointing toward the top of drawing page. As can be seen in diagram 408, surface 404B of electronic circuit component 404A, surface 404J of the preliminary bonding material 404F, and surface 406D of the planarization or other bonding material 406A are substantially in-line, even or planar to each other with no gaps. This permits a depositing device 408A to print conductive traces 408B which extend off of the electronic circuit component 404A across the preliminary bonding material 404F and the planarization bonding material 406A in a substantially planar manner.

Figure 6:
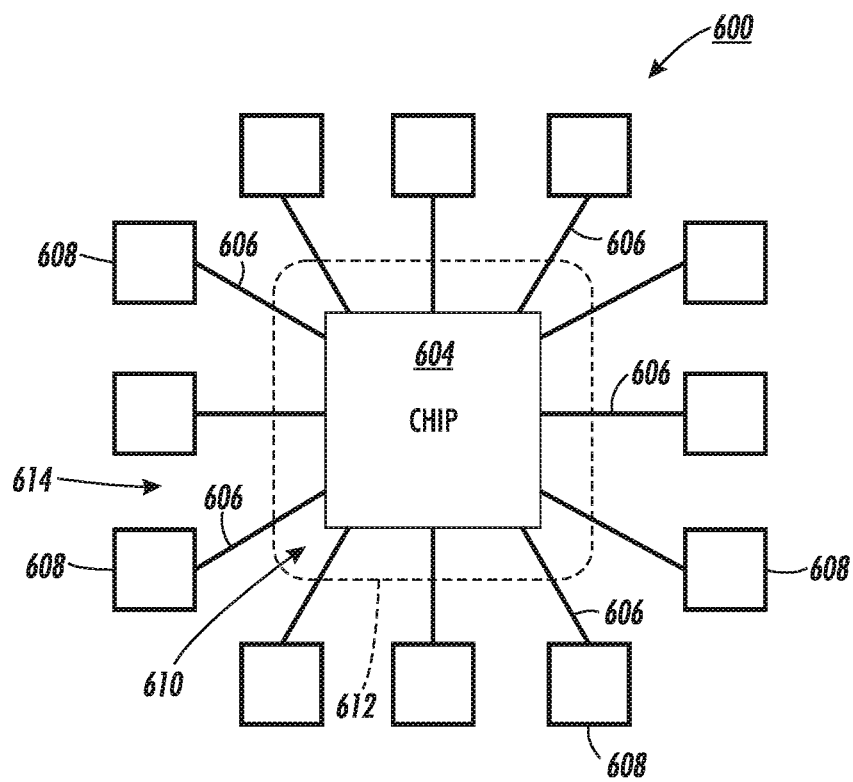
FIG. 6 illustrates a top view of the embedded electronic circuit component having electrical traces extending out to external pads or components, illustrating the more rigid substrate range and flexible substrate range as discussed in connection with FIGS. 4 and 5.

In at least one embodiment, the preliminary bonding material 404F is of a composition that is more rigid (less flexible) than the chemical composition of the planarization bonding layer 406A. This aspect allows for the formation of a more rigid structure closer (e.g., 404F) to the electronic circuit component 404A, while the remaining portion (e.g., 406A) of the substrate. The fixed preliminary bonding material 404F (more rigid) and the planarization or other bonding material 406A (less rigid) may be considered a substrate on which electronic components may be provided and/or lead to other electronic devices (e.g., electronic chips, such as shown in FIG. 6)).

Figure 5:
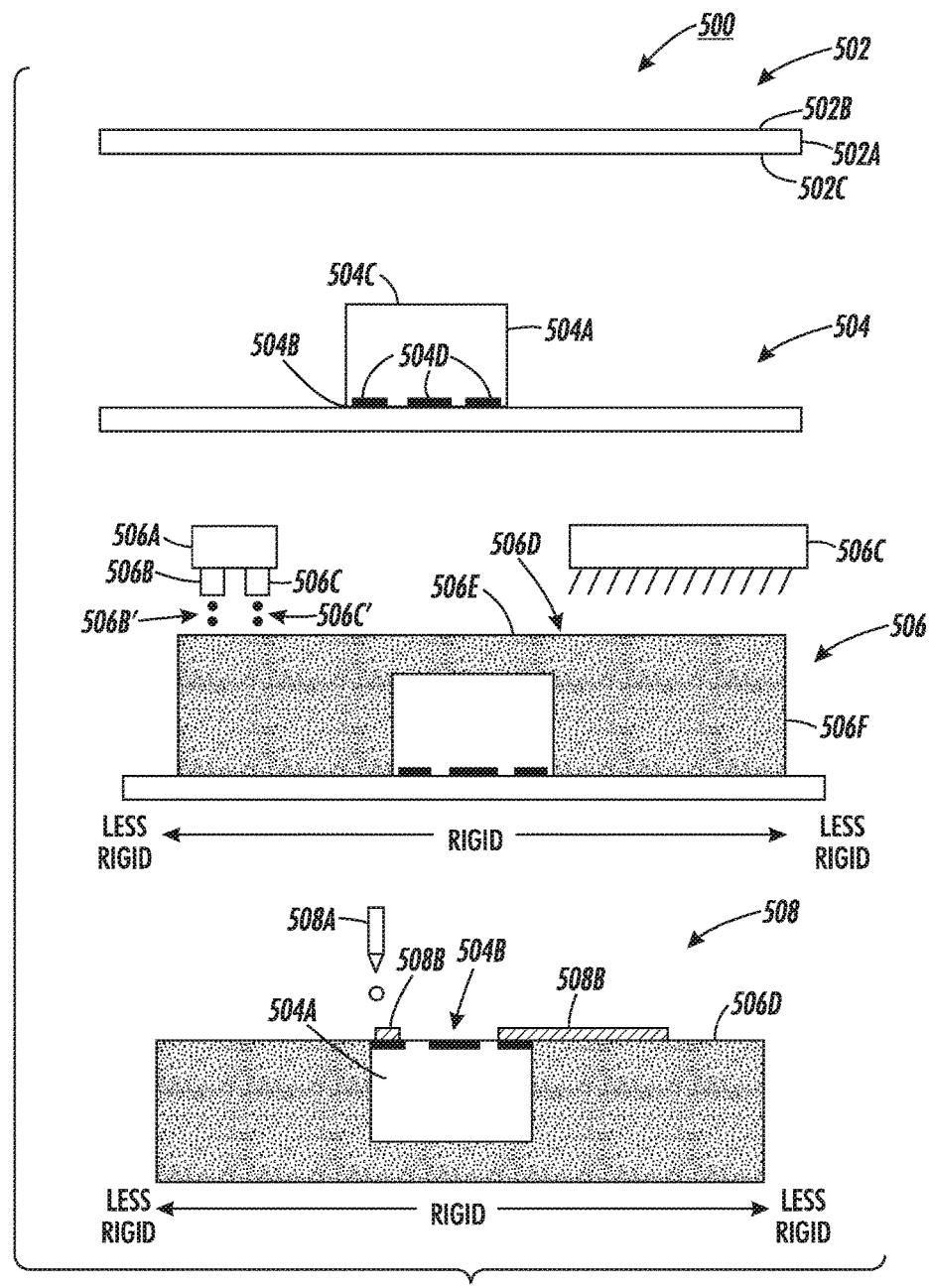
FIG. 5 illustrates another embodiment of a process according to the present application for embedding an electronic circuit component with a substrate having a gradient of rigidity along its length.

Turning to FIG. 5, depicted is a process 500, including diagrams 502, 504, 506 and 508, which illustrate the formation of an embedded electronic circuit component (e.g., chip) with a substrate whose rigidity is a gradient from more rigid to less rigid (more flexible) as the distance from the electronic circuit component increases. Similar to the previous embodiments, diagram 502 shows a tacky layer 502A having a front or first side 502B which carries a tacky material and a second surface 502C. Diagram 504, similar to the previous embodiments shows an electronic circuit component 504A, having a front or first side surface 504B and a back or second side or surface 504C. On the top or front surface 504B are electronic elements 504D (e.g., including but not limited to conductive traces and contact pads) 504D. The electronic circuit component 504A is in physical contact with the tacky front or first surface 502B of tacky layer 502A. This maintains the electronic circuit component 504A in a secured (but not permanently fixed) position. This arrangement does not allow a liquid chemical to leak into the area under 504A and does not allow movement during the remainder of the process.

Turning to diagram 506, a depositing device 506A is shown to include at least two separate depositing elements (e.g., print heads) 506B and 506C, to deposit a planarization bonding material layer 506D. The depositing device 506A, which may be any of a number of known printing devices or extrusion devices, as previously discussed. In one embodiment, depositing element 506B is supplied with a first bonding material composition 506B', and depositing element 506C is supplied with a second bonding material composition 506C'. The first bonding material composition 506B' is designed to be more rigid than the second bonding composition.

The depositing device 506A is controlled to deposit the more rigid bonding composition 506B' nearer the electronic circuit component 504A, and the second bonding material composition 506C' more distant. It is understood that in certain embodiments the depositing elements 506B and 506C are controlled such that the first and second bonding compositions 506B', 506C' are mixed at locations in predetermined percentages to create a smooth gradient from rigid to less rigid, as the depositing moves more distant from the electronic circuit component 504A as shown in FIG. 5.

Thus, the area 506E represents a more rigid non-flexible bonding material composition, where the area 506F is a more flexible bonding material composition. Once deposited a fixing or curing device 506G is operated to fix or cure the compositions for a permanent holding of the electronic circuit component 504A. Once the bonding material layer 506D has been fixed, the tacky layer 502A is removed using known techniques.

As shown in diagram 508 the assembly has been rotated 180° such that the upper or first surface 504B is now pointing toward the upper end of the page, which results in the upper or first side 508A of the bonding material 506D to be substantially in-line or planar to the first or upper side 504B of the electronic circuit component 504A. This, as in the previous embodiments, allows a depositing device (e.g., a printer) 508A to print conductive traces 508B across the electronic conductive component 504A and the fixed or cured bonding material layer 506D, which now acts as a substrate for the electronic circuit component 504A.

Thus, similar to the process of FIG. 4, in FIG. 5, the resulting substrate structure (e.g., the fixed or cured bonding material layer 506D) of diagram 508 is more rigid the closer to the electronic circuit component 504A, and the more flexible (i.e., fixed or cured bonding material) the more distant from the electronic circuit component 504A. A distinction between the two embodiments of FIGS. 4 and 5 is that while the process of FIG. 4 requires two separate fixing or curing operations, the embodiment of FIG. 5 provides for a single fixing or curing operation.

It is understood that in the depositing device 506A shown in diagram 506, two depositing elements 506B and 506C are shown. It is to be understood that this might be designed in other embodiments to include more depositing elements to increase the speed of operation. Also, in still further embodiments, it may be possible to use a single depositing element wherein what is fed to that element may be altered depending upon the location of the depositing operations. For example, the depositing device 506A may be computer controlled to first deposit the bonding material (more rigid material) near the electronic circuit component 504A. Then as it moves forward, it is fed with a more flexible bonding composition.

Turning to FIG. 6, illustrated is a top view 600 of an arrangement employ the concepts of FIGS. 4 and 5 which have been discussed. More particularly, an electronic circuit component 604 similar to the previously discussed electronic circuit components (404A and 504A) is shown with conductive traces 606 (not all traces are numbered), which extend out to contact pads and/or electronic devices 608 that are on or past the described substrate (e.g., fixed or cured bonding material; e.g., 406A of FIG. 4, and 506A of FIG. 5). As shown in FIG. 6, an area 610, within a dashed line 612 (closer to the electronic circuit component 604) represents a more rigid substrate area than the material or area 612 extending past the dotted line 612 to the electronic components 608.

The embodiments of FIGS. 3, 4, 5 describe methods and arrangements where electrical conductive traces are laid down between electronic circuit components and distant connections (e.g., contact pads) in rampless designs.

Figure 7:
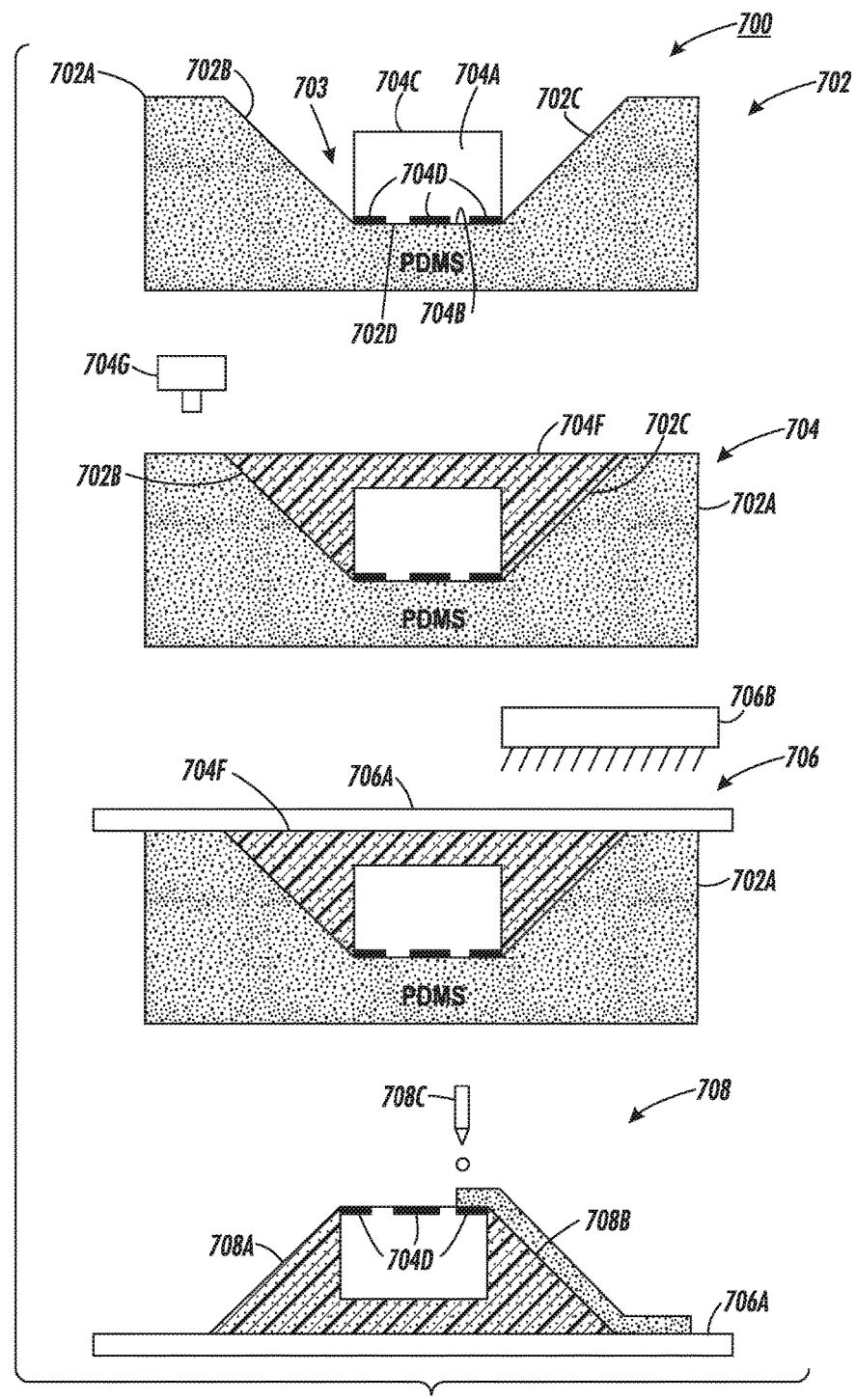
FIG. 7 illustrates an embodiment of a process according to the present application wherein a shaped tacky material is used to form a ramp for making electrical connections.

Turning to FIG. 7, illustrated is another embodiment of a process 700 including diagrams 702, 704, 706 and 708. In diagram 702, a tacky material 702A (e.g., PDMS) is designed with sloping side walls 702B, 702C and a flat planar area 702D there between, creating a cavity portion 703. An electronic circuit component 704A (similar to those previously discussed) includes a first or front side or surface 704B and a second or back side or surface 704C, where the front or first surface 704B includes conductive tracings (including contact pads) 704D, similar to those previously discussed. In diagram 702, the electronic circuit component 704A is placed in contact with the planar surface 702D, such that it is in a non-permanently fixed association.

In diagram 704, it is shown that a bonding material 704F is deposited by depositing device 704G into the cutout area or cavity 703 formed by sloping walls 702B, 702C of tacky material 702A. It is filled up to be substantially level with the tacky material 702A. Thereafter, in diagram 706, a flexible transparent substrate 706A is positioned over the cutout area, and a curing or fixing component 706B cures or fixes the bonding material 704F.

Thereafter, and similar to previous embodiments, the tacky material 702A is removed, and as shown in diagram 708, the first or front surface 704B of the electronic component device 704A is in a fixed position wherein ramps 708A, 708B are provided. In this embodiment, a printer 708C prints a conductive trace 708D extending between the electronic circuit component 704A onto the substrate 706A.

Figure 8:
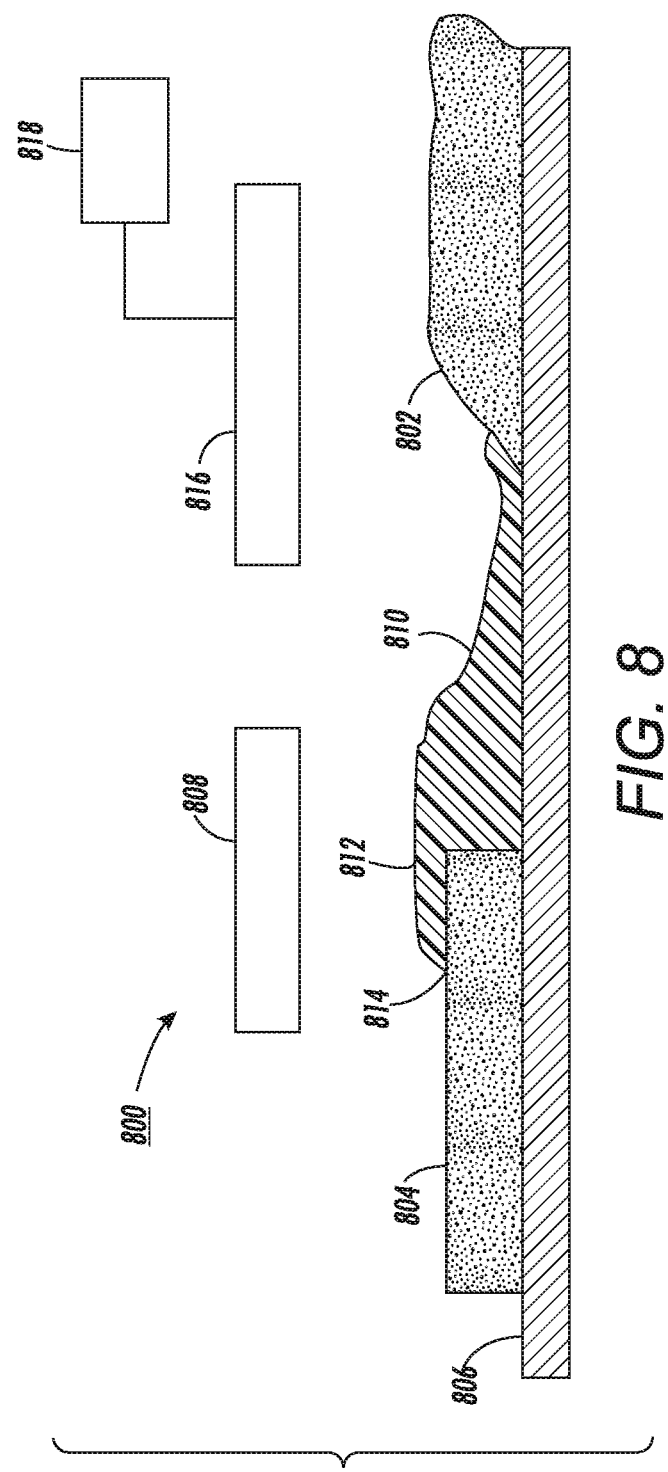
FIG. 8 illustrates a side view of a printed interconnect to integrated circuits.
Figure 9:
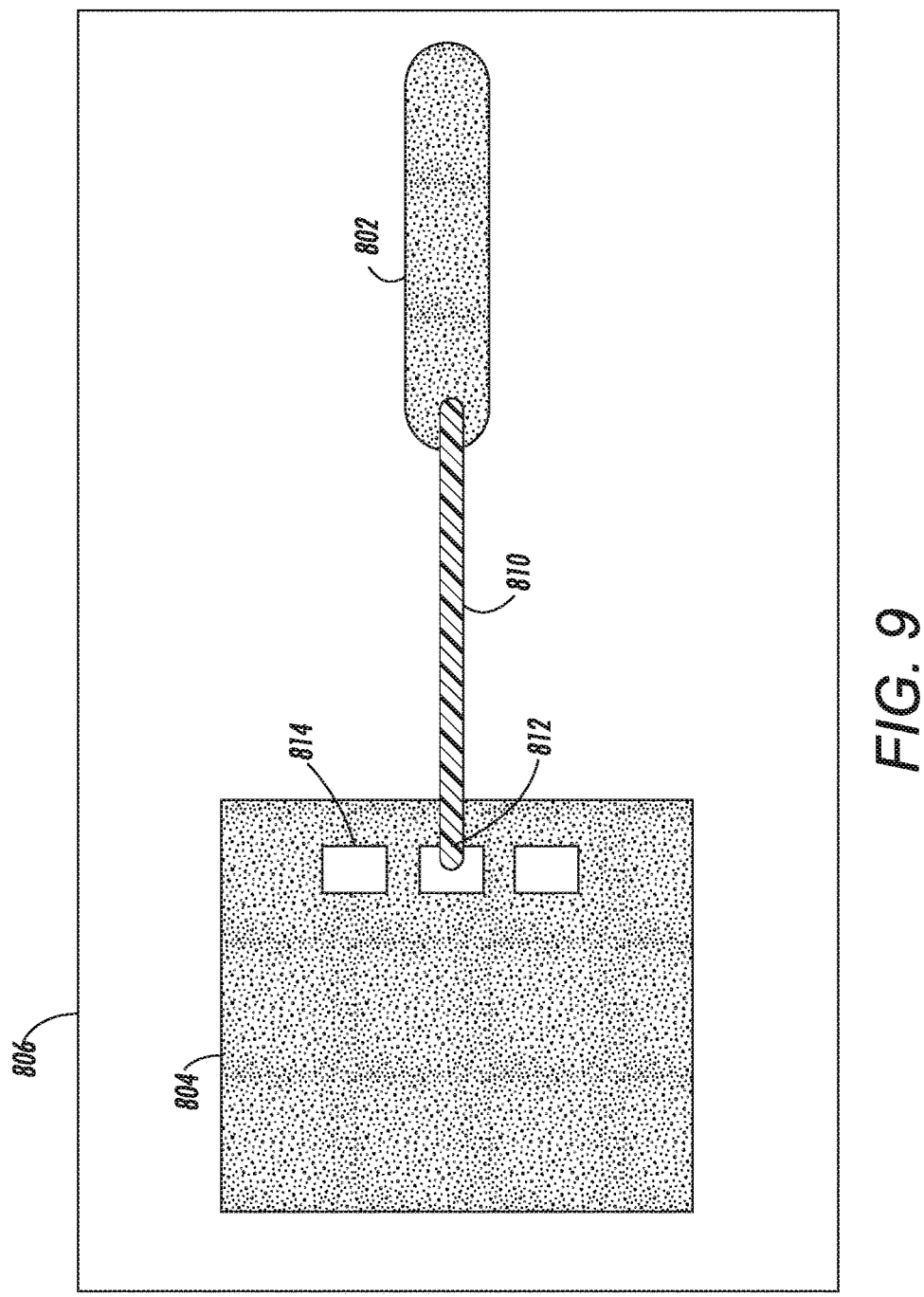
FIG. 9 shows a top view of FIG. 8.

Turning now to FIGS. 8 and 9, it is known that combining hybrid electronic circuits to include electronic circuit components (e.g., packaged or bare die ICs) with printed electronics is a challenge due to the relative size differences between what can be achieved with printed conductive tracks and the small size and density of connection pads such as on Integrated Circuits (ICs). One must also solve the issue of how the IC is oriented to make the most reliable connection to the printed conductors. One way is to have the IC with the connection pads facing up. However, the printing method would have to be able to transition from the substrate surface level where the IC is placed to the ICs top surface where the connection pads are located.

The present embodiment of FIGS. 8 and 9 describe a method and arrangement which connects the IC pads to printed conductors on the substrate surface with the use of focused aerosol deposition device (e.g., from Optomec). The method uses accurate knowledge of the IC's location and geometry along with the location of the pads to connect in relation to a printed conductor trace with which a connection is to be made.

As illustrated in the side view of FIG. 8, the method and arrangement 800 shows a portion of an extruded conductor 802 and a portion of an electronic circuit component (e.g., bare die, IC, etc.) 804 a certain known distance from each other on a substrate 806. The process includes using deposition system 808, such as an aerosol deposition device for generating a printed trace (e.g., 20 to 40 µm line width). The system 808 is made to operate at a specific drawing speeds. Particularly as the conductive trace is being drawn from an edge of the electronic circuit component 802, the printing speed is slowed down to deposit an increasingly tall trace 810 in order to match the height of the electronic circuit component 804, when the deposited conductive material (i.e., in the form of trace 810) reaches the edge of the electronic circuit component 804B. From there the speed is increased to reduce the height 812 of the conductive trace. Particularly, the height of the trace 810 at location 812 is much less than the height of the trace prior to reaching the component 804. The trace is continued until the contact pad 814 is reached.

In one embodiment, an exact electronic circuit component location placed on a substrate is determined through calibrated machine vision element 816, and the electronic circuit component step height obtained in combination with an optical profiler element 818 (for example, by a Precitec confocal instrument from Precitec Group).

Figure 10A:
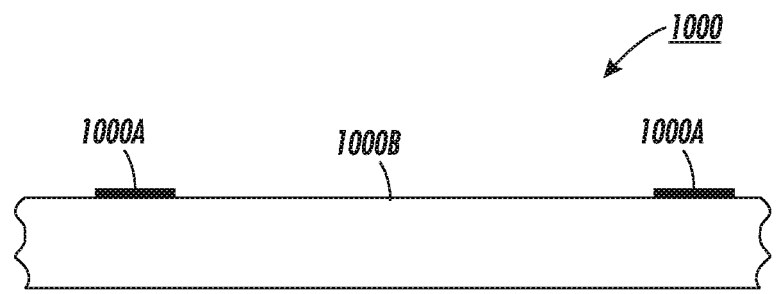
FIGS. 10A and 10B illustrate a substrate and an electronic circuit component which may be used in connection with the present teachings.
Figure 10B:
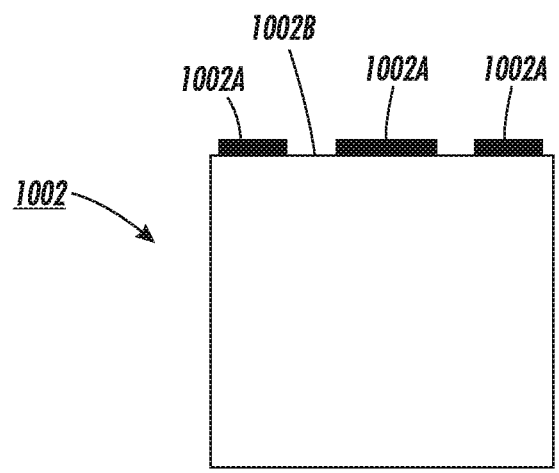

Turning now to FIGS. 10A and 10B. In the foregoing embodiments, the respective electronic circuitry is substantially level or planar with a surface of the respective substrates. However, it is to be understood the present concepts are also applicable when the electronic circuitry and substrates are not level. For example, in FIGS. 10A and 10B, illustrated is a substrate 1000 and an electronic circuit component 1002. As can be seen, the electronic circuitry or traces 1000A on substrate 1000, and electronic circuity or traces 1002A on electronic component 1002, rise in profile above the respective surfaces 1000B, 1002B. In certain embodiments, the profiles are from substantially 1 to 20 microns, and more particular embodiments, are in the range of 10 to 20 microns above the respective surfaces (e.g., 1000B, 1002B). For example, when the electronic circuity component 1002 is placed in contact with a material (for example, PDMS) which is sufficiently soft, this allows elements 1002A to push into the PDMS material providing an appropriate positioning arrangement for the remainder of the process to be undertaken.

Also, when a conductive trace is formed between substrate 1000 and component 1002, there is sufficient depositing height to generate a substantially flat conductive line such as shown in the preceding figures.

The foregoing figures and discussions are noted to show embodiments for the fabrication of hybrid electronic platforms.

SUMMARY

The preceding discussion has described a method of forming an electronic assembly including the steps of providing a tacky layer. Providing an electronic circuit component having a first side and a second side, the first side carrying electronics. Positioning the first side of the electronic circuit component into contact with the tacky layer. Depositing a bonding material to a portion of the tacky layer not covered by the first side of the electronic circuit component to depth which substantially covers the second side of the electronic circuit component. Curing the bonding material into a cured bonding material. Finally, removing the tacky layer, wherein the electronic circuit component is held in secure attachment by the cured bonding material.

Aspects of the described method are set forth below.

The first surface of the electronic circuit component and a first surface of the cured bonding material are substantially planar to each other.

Conductive traces are laid down between the cured bonding material and the first surface of the electronic circuit component.

A preliminary bonding material is deposited prior to the step of depositing the bonding material. The preliminary bonding material extends along a portion of the tacky layer and up in a height direction along sides of the electronic circuit component. Then the preliminary bonding material is cured into a preliminary cured bonding material prior to the step of depositing the bonding material. The preliminary cured bonding material has a stiffer constitution than the cured bonding material.

The deposited curable material consists of a stiffer material composition closer to the electronic circuit component and a less stiff material composition farther away from the electronic circuit component.

The deposited curable material consists of (i) a stiffer material composition and (ii) a less stiff material composition are cured at substantially the same time during a same curing operation.

The depositing is accomplished using at least two different print heads, containing different curable material compositions.

The depositing is accomplished using a single print head with a varying UV curable polymer material.

The tacky layer is formed with a cavity portion defined by sloping sides and a planar portion between the sloping sides, the planar portion being sized to receive the electronic circuit component. The positioning of the first side of the electronic circuit component in contact with the tacky layer is on a surface of the planar portion, wherein the first surface is in contact with a surface of the planar portion of the tacky layer. The depositing further including depositing the curable material to a portion of the tacky layer not covered by the first side of the electronic circuit component to a depth which substantially covers the backside of the electronic circuit component, substantially filing in the remaining cavity portion with the bonding material.

A substantially transparent substrate on the surface of the tacky layer and a surface of the bonding material. The curing of the bonding material includes providing curing through the transparent substrate to the bonding material to cure the bonding material. The removing of the tacky layer provides a ramp configuration on each side of the conductive electronic component.

The depositing of the bonding material is at least one of ink-jet type printing, aerosol type printing, and extrusion type printing.

The described steps form an electronic chip which includes an electronic circuit component having electronic elements on a first surface; a cured bonding material having a depth sufficient to substantially cover the second surface of the electronic circuit component, wherein the electronic circuit component is held in a secured relationship by the cured bonding material; an upper surface composed of the first surface of the electronic circuit component and at least a portion of the cured bonding material; and printed conductive traces extending between the cured bonding material and the first surface of the electronic circuit component.

The assembly being designed where the cured bonding material consists of more than a single bonding material composition, wherein a bonding material composition closer to the electronic circuit component has a stiffer composition than another bonding material composition farther from the electronic circuit component.

The first surface of the electronic circuit component and a first surface the cured bonding material are substantially planar with respect to each other.

The cured bonding material is formed in a ramp configuration on each side of the conductive electronic component.

The depositing of the bonding material is at least one of ink-jet type printing, aerosol type printing, and extrusion type printing.

In another embodiment disclosed is a method of forming an electronic assembly including, providing a conductor on a substrate; providing an electronic circuit component on the substrate distanced from the conductor, wherein a height of the conductor is less than a height of the electronic circuit conductor; and determining the difference in height and distance between the conductor and the electronic circuit component operating an aerosol printing device to change speeds of depositing dependent upon the determined difference between the conductors and the electronic circuit component, and thereby alter the amount of material aerosol printer is laying down at a particular area.

The method above, further includes slowing the aerosol printer down as it nears the electronic circuit component, thereby increasing the depth of the material until the material depth is equal to or above the height of the electronic circuit component, and speeding up the movement of the aerosol printer thereafter.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A method of forming an electronic assembly comprising:
   providing a tacky layer;
   providing an electronic circuit component having a first side and a second side, the first side carrying electronics;
   positioning the first side of the electronic circuit component into contact with the tacky layer;
   depositing a bonding material to a portion of the tacky layer not covered by the first side of the electronic circuit component to a depth which substantially covers the second side of the electronic circuit component;
   curing the bonding material into a cured bonding material, wherein the deposited cured bonding material consists of a stiffer material composition closer to the electronic circuit component and a less stiff material composition farther away from the electronic circuit component, and wherein the deposited cured bonding material consisting of the stiffer material composition and the less stiff material composition are cured at substantially a same time during a same curing operation; and
   removing the tacky layer, wherein the electronic circuit component is held in secure attachment by the cured bonding material.

2. The method according to claim 1 wherein the depositing is accomplished using at least two different print heads, containing different curable bonding material compositions.

3. The method according to claim 1 wherein the depositing is accomplished using a single print head and wherein the bonding material is a varying UV curable polymer material.

4. A method of forming an electronic assembly comprising:
   providing a tacky layer;
   providing an electronic circuit component having a first side and a second side, the first side carrying electronics;
   positioning the first side of the electronic circuit component into contact with the tacky layer;
   depositing a bonding material to a portion of the tacky layer not covered by the first side of the electronic circuit component to a depth which substantially covers the second side of the electronic circuit component;
   curing the bonding material into a cured bonding material; and
   removing the tacky layer, wherein the electronic circuit component is held in secure attachment by the cured bonding material,
   wherein the tacky layer is formed with a cavity portion defined by sloping sides and a planar portion between the sloping sides, the planar portion being sized to receive the electronic circuit component,
   wherein the first side of the electronic circuit component is positioned in contact with the tacky layer on a surface of the planar portion, wherein the first side is in contact with the surface of the planar portion of the tacky layer; and wherein the depositing further includes depositing the cured bonding material to a portion of the tacky layer not covered by the first side of the electronic circuit component to a depth which substantially covers the second side of the electronic circuit component, thereby filing in the remaining cavity portion with the bonding material.

5. The method according to claim 1 wherein the first side of the electronic circuit component and a first surface of the cured bonding material are substantially planar to each other.

6. The method of claim 5 further including laying down conductive traces between the cured bonding material and the first side of the electronic circuit component.

7. The method according to claim 1 further including:
depositing a preliminary bonding material prior to the step of depositing the bonding material, wherein the preliminary bonding material extends along a portion of the tacky layer and up in a height direction along sides of the electronic circuit component; and
curing the preliminary bonding material into a preliminary cured bonding material prior to the step of depositing the bonding material, and wherein the preliminary cured bonding material has a stiffer constitution than the cured bonding material.

8. The method according to claim 1 further including:
positioning a substantially transparent substrate on a surface of the tacky layer and a surface of the bonding material;
the curing of the bonding material includes providing curing through the transparent substrate to the bonding material to cure the bonding material; and
the removing of the tacky layer provides a ramp configuration on each side of the conductive electronic component.

9. The method according to claim 1 wherein the depositing of the bonding material is at least one of ink-jet type printing, aerosol type printing, and extrusion type printing.

10. The method of claim 4 further including laying down conductive traces between the cured bonding material and the first side of the electronic circuit component.

11. The method according to claim 4 further including:
depositing a preliminary bonding material prior to the step of depositing the bonding material, wherein the preliminary bonding material extends along a portion of the tacky layer and up in a height direction along sides of the electronic circuit component; and
curing the preliminary bonding material into a preliminary cured bonding material prior to the step of depositing the bonding material, and wherein the preliminary cured bonding material has a stiffer constitution than the cured bonding material.

12. The method according to claim 4 wherein the deposited cured bonding material consists of a stiffer material composition closer to the electronic circuit component and a less stiff material composition farther away from the electronic circuit component.

13. The method according to claim 4 further including:
positioning a substantially transparent substrate on a surface of the tacky layer and a surface of the bonding material;
the curing of the bonding material includes providing curing through the transparent substrate to the bonding material to cure the bonding material; and
the removing of the tacky layer provides a ramp configuration on each side of the conductive electronic component.

\* \* \* \* \*